United States Patent [19]

Reagan et al.

[11] Patent Number: 4,774,127
[45] Date of Patent: Sep. 27, 1988

[54] FABRICATION OF A MULTILAYER CONDUCTIVE PATTERN ON A DIELECTRIC SUBSTRATE

[75] Inventors: John J. Reagan; Peggy J. Parks, both of Beaverton; Nancy L. Miller, Portland; Robert L. Beckman, Beaverton, all of Oreg.

[73] Assignee: Tektronix, Inc., Beaverton, Oreg.

[21] Appl. No.: 61,741

[22] Filed: Jun. 15, 1987

[51] Int. Cl.[4] .......................... B32B 3/00; B32B 9/00
[52] U.S. Cl. .................................... 428/209; 428/458; 428/473.5; 428/901; 174/68.5; 430/297; 430/311
[58] Field of Search ............... 428/209, 458, 473.5, 428/901; 174/68.5; 430/297, 311, 313, 314, 318, 319, 322, 323, 324, 325, 327

[56] References Cited

U.S. PATENT DOCUMENTS

| | | | |
|---|---|---|---|
| 3,934,067 | 1/1976 | Goldman et al. | 428/290 |
| 3,936,575 | 2/1976 | Watanabe et al. | 428/417 |
| 3,955,024 | 5/1976 | Goldman et al. | 428/482 |
| 3,985,928 | 10/1976 | Watanabe et al. | 428/473.5 |
| 4,201,616 | 5/1980 | Chellis et al. | 428/416 |
| 4,671,984 | 6/1987 | Maeda et al. | 428/461 |
| 4,675,246 | 6/1987 | Kundinger et al. | 428/336 |
| 4,680,220 | 7/1987 | Johnson | 428/473.5 |

*Primary Examiner*—John E. Kittle
*Assistant Examiner*—P. J. Ryan
*Attorney, Agent, or Firm*—Francis I. Gray

[57] ABSTRACT

A pattern of conductive material is formed on a substrate of dielectric material. The substrate comprises a layer of flexible dielectric material having a layer of dimensionally-stable material adhered to one main face. The pattern is formed on the opposite main face of the layer of flexible dielectric material.

17 Claims, 1 Drawing Sheet

FABRICATION OF A MULTILAYER CONDUCTIVE PATTERN ON A DIELECTRIC SUBSTRATE

BACKGROUND OF THE INVENTION

This invention relates to the fabrication of a multilayer pattern on a dielectric substrate.

A material that is to be used as the substrate for a multilayer conductor pattern, for example in a hybrid integrated circuit, should have high dimensional stability, in order to ensure that the tolerances within which the photoprocessing masks for successive layers of the multilayer conductor pattern must be aligned do not need to take account of possible changes in the dimensions of the substrate. Ceramic materials, such as alumina, have high dimensional stability and therefore have been used as the substrate for a multilayer conductor pattern. However, ceramic materials are subject to limitation in that they are not flexible and therefore cannot be used as the substrate for a flexible circuit.

Polyimide is flexible, and its electrical properties favor its use as the substrate for a conductor pattern. However, a planar sheet of polyimide has relatively poor dimensional stability, and this has previously militated against its use as the substrate for a multilayer conductor pattern because it precludes use of fine alignment tolerances between successive layers of the pattern.

A planar sheet of copper has better dimensional stability than a planar sheet of polyimide. Sheet-form polyimide with copper adhered to one or both main surfaces of the polyimide sheet is commercially available.

SUMMARY OF THE INVENTION

A preferred embodiment of the present invention is a method of forming a pattern of conductive material on a substrate of dielectric material. A sheet-form substrate of flexible dielectric material having a layer of dimensionally-stable material adhered to one main face has a layer of metal formed on its other main face in accordance with a predetermined pattern.

It is preferred that the flexible dielectric material be polyimide and that the layer of dimensionally-stable material be copper. The layer of copper imparts sufficient dimensional stability to the polyimide sheet to allow a multilayer pattern of conductive material to be formed on the substrate without its being necessary to employ tolerances that are significantly larger than those employed when forming a multilayer pattern on a ceramic substrate.

BRIEF DESCRIPTION OF THE DRAWINGS

For a better understanding of the invention, and to show how the same may be carried into effect, reference will now be made, by way of example, to the accompanying drawings in which.

Figure 1:
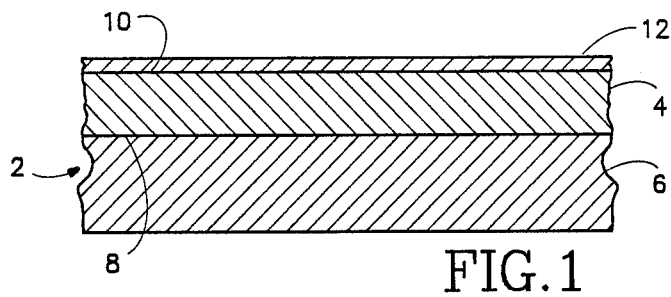
FIGS. 1–4 illustrate successive steps in the fabrication of a multilayer pattern of conductive material on a substrate.

In the drawings, the relative thicknesses of the various layers have been distorted for the sake of clarity of illustration.

DETAILED DESCRIPTION

Figure 2:
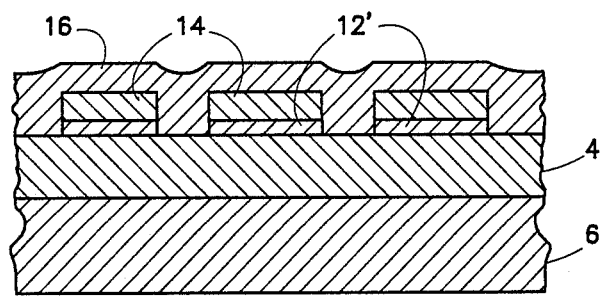
Figure 3:
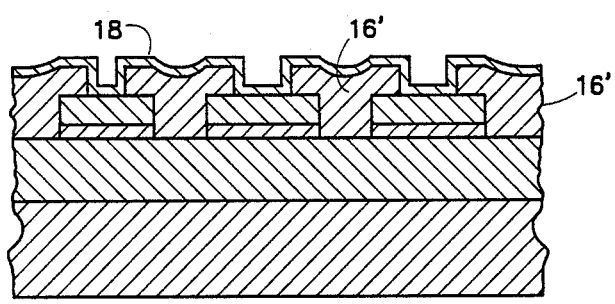
Figure 4:
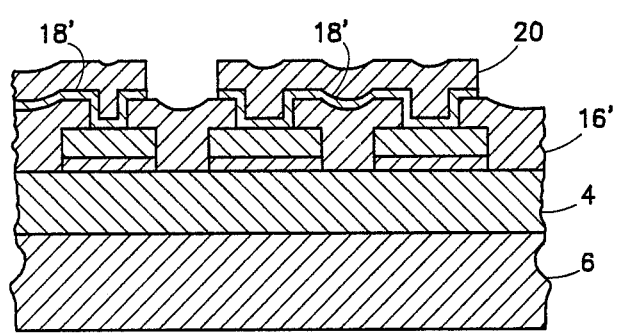

Referring now to FIGS 1–4, a sheet 2 of composite polyimide/copper material comprises a layer 4 of polyimide and a layer 6 of copper adhered to one main face 8 of the polyimide layer 4. Typically, the layer of polyimide would be from 0.025 mm to 0.125 mm thick and the layer of copper would be from 0.1 mm to 0.25 mm thick. The lower end of the range of thicknesses for the copper layer is dictated by the need for the copper layer to be sufficiently sturdy to withstand handling. If the sheet 2 is handled with care, the copper layer could be as thin as 0.025 mm. The opposite main face 10 of the layer 4 is exposed.

The sheet 2 of composite polyimide/copper material is cleaned, and a metal layer is then formed on the main face 10 of the polyimide layer by evaporative deposition. The metal layer 12 is patterned, using a conventional photoprocessing operation. The pattern may include features provided specifically for registration purposes. The patterned metal layer 12' is too thin for use in a hybrid circuit, and therefore the patterned metal layer 12' is used as the cathode in an electroplating operation in which gold is deposited so as to create a layer 14 having the desired thickness and conforming to the pattern of the layer 12'. In this manner, a first layer of the multilayer pattern of conductive material is provided on the substrate.

A layer 16 of polyimide is spun onto the patterned conductor layer 12'/14. The layer 16 is patterned using a conventional photoprocessing technique, to remove the polyimide at locations at which it is desired to make connections to the patterned conductor layer 12'/14. The patterned polyimide layer 16' is then cleaned and a layer 18 of metal is provided over the polyimide by evaporative deposition. The layer 18 is patterned, and the patterned layer 18' is used as the cathode in an electroplating operation in which gold is deposited so as to create a layer 20 having a desired thickness and conforming to the pattern of the layer 18'. A second layer of the multilayer pattern of conductive material is thereby provided.

The photoprocessing masks that are used to pattern the layers 16 and 18 are positioned by reference to registration features of the layer 12'/14, such as contact pads or features provided especially for registration purposes.

Assuming that the multilayer pattern comprises only two layers, the copper layer 6 is then removed. If multiple patterns have been formed on a common substrate, the substrate is diced into units.

Preferably, the layers 12 and 18 each comprise three films, of titanium, palladium and gold respectively. Use of titanium, palladium, gold systems is well-known in the fabrication of thin film hybrid circuits.

It is important that the composite material of the sheet 2 be stable, e.g. that the copper layer remain firmly adhered to the polyimide layer and that the composite material not out-gas. In the case of the sheet 2, this is achieved by virtue of the fact that the copper layer 6 is bonded directly to the polyimide layer 4, without use of an intermediate layer of adhesive. Such composite materials are commercially available. However, the copper layer may be bonded to the polyimide layer using an intermediate layer of adhesive if the adhesive material is selected so that it is not degraded during formation of the multilayer pattern and does not outgas.

Composite materials comprising a layer of polyimide with two layers of copper adhered to opposite respective main faces of the polyimide layer are commercially available. One of the copper layers may be patterned to provide the first layer of the multilayer pattern of conductive material, instead of forming the layer 12' by evaporative deposition and patterning and then adding metal by electroplating to create a layer of the desired thickness.

Dimensional stability is important not only in achieving proper registration of the second (and any subsequent) layers of a multilayer pattern with the preceding layer or layers, but also in other operations which are carried out by reference to features of a layer that is formed on a flexible substrate. For example, if holes are drilled in the substrate by first aligning a drilling machine with reference to a registration feature that is formed concurrently with the first layer and then displacing the drilling machine by a fixed distance, a hole that is drilled after displacement of the drilling machine might not be properly positioned relative to the registration feature if the substrate has shrunk or stretched. This problem can be avoided by use of a composite substrate comprising a layer of flexible material and a layer of dimensionally stable material adhered thereto.

The foregoing description has not been burdened with an extensive explanation of conventional techniques for etching and depositing materials, since persons skilled in the art are familiar with these techniques and such an explanation does not aid in understanding the invention.

It will be appreciated that the present invention is not restricted to the particular method that has been described, and that variations may be made therein without departing from the scope of the invention as defined in the appended claims and equivalents thereof. For example, it is not necessary to remove the copper layer from the polyimide, since it could be patterned and used as an additional conductor. The number of times that the sequence of evaporative deposition and electroplating is repeated is not critical.

We claim:

1. A method of manufacturing an intermediate structure in the fabrication of a multilayer pattern of conductive material on a substrate of dielectric material, comprising the steps of:
   (a) providing a substrate of dielectric material having first and second main faces and having a layer of dimensionally-stable material adhered to said first main face, and
   (b) forming a layer of metal on the second main face of the substrate in accordance with a predetermined pattern.

2. A method according to claim 1, further comprising the step of electrolytically depositing metal on the layer form in step (b).

3. A method according to claim 1, wherein step (b) is performed by depositing a continuous layer of metal on the second main face and patterning the layer of metal, and the method further comprises the step of electrolytically depositing metal on the layer formed in step (b).

4. A method according to claim 3, wherein the continuous layer of metal is deposited on the second main face by evaporative deposition.

5. A method according to claim 1, further comprising the steps of:
   (c) forming a layer of dielectric material over the layer of metal, the layer of dielectric material having at least one opening through which the layer formed in step (b) is exposed, and
   (d) forming a second layer of metal over the layer of dielectric material, the second layer of metal extending into the opening and contacting the first-mentioned layer of metal.

6. A method according to claim 5, further comprising the step of electrolytically depositing metal on the layer formed in step (d).

7. A method according to claim 6, comprising the step of removing the layer of dimensionally-stable material from the first main face of the substrate.

8. A method of manufacturing an intermediate structure in the fabrication of a multilayer pattern of conductive material on a substrate of dielectric material, comprising the steps of:
   (a) providing a substrate of dielectric material having first and second main faces,
   (b) adhering a layer of dimensionallystable material to said first main face, and
   (c) forming a layer of metal on the second main face of the substrate in accordance with a predetermined pattern.

9. A method according to claim 8, comprising the step of subsequently removing the layer of dimensionally-stable material from said first main face of the substrate.

10. In combination, a substrate of dielectric material having first and second main faces and having a layer of dimensionally-stable material adhered to said first main face, and a layer of metal on the second main face of the substrate in accordance with a predetermined pattern.

11. A substrate of dielectric material having a multilayer pattern of conductive material thereon, manufactured by a method in accordance with claim 1.

12. A method of manufacturing a structure comprising a substrate of dielectric material and a multilayer pattern of conductive material attached thereto, comprising the steps of:
   (a) providing a substrate of dielectric material having first and second main faces and having a layer of dimensionally-stable material adhered to said first main face and also having a layer of metal on the second main face of the substrate in accordance with a predetermined pattern,
   (b) forming a layer of dielectric material over the layer of metal on the second main face of the substrate, the layer of dielectric material having at least one opening through which the layer of metal is exposed, and
   (c) forming a second layer of metal over the dielectric material, the metal of the second layer extending into the opening and contacting the metal of the first layer.

13. A method of manufacturing an article comprising a sheet of material that lacks dimensional stability, the sheet having a registration feature and being acted upon at a location that is determined by reference to the location of the registration feature, said method comprising the steps of:
   providing a sheet of a first material that lacks dimensional stability, the sheet of the first material having a sheet of a second, dimensionally-stable material adhered to one main face thereof and also having a registration feature, and
   acting upon the sheet of the first material at a location that is determined by reference to the location of the registration feature.

14. A method of manufacturing a flexible printed circuit board having a multilayer pattern of conductive material on a substrate of dielectric material comprising the steps of:

first providing the substrate of dielectric material having first and second main faces with a layer of dimensionally stable material adhered to the first main face to maintain dimensional stability of the flexible printed circuit board during the manufacturing process;

then forming the multilayer pattern of conductive material on the second main face; and finally removing the layer of dimensionally stable material from the first main face.

15. A flexible printed circuit board manufactured in accordance with the method of claim 14.

16. A method of manufacturing a flexible printed circuit board having a multilayer pattern of conductive material on a substrate of dielectric material comprising the steps of:

first providing the substrate of dielectric material having first and second main faces with a layer of dimensionally stable material adhered to the first main face to maintain dimensional stability of the flexible printed circuit board during the manufacturing process;

then forming the multilayer pattern of conductive material on the second main face; and finally forming the layer of dimensionally stable material into a circuit pattern.

17. A flexible printed circuit board manufactured in accordance with the method of claim 16.

* * * * *